United States Patent [19]

Henery

[11] Patent Number: 4,853,257

[45] Date of Patent: Aug. 1, 1989

[54] CHEMICAL VAPOR DEPOSITION OF TIN OXIDE ON FLOAT GLASS IN THE TIN BATH

[75] Inventor: Vern A. Henery, Pittsburgh, Pa.

[73] Assignee: PPG Industries, Inc., Pittsburgh, Pa.

[21] Appl. No.: 103,090

[22] Filed: Sep. 30, 1987

[51] Int. Cl.$^4$ .................... B05D 5/06; C23C 16/40
[52] U.S. Cl. .................... 427/166; 427/160; 427/255; 427/255.3
[58] Field of Search ............... 427/160, 165, 166, 255, 427/255.3, 314

[56] References Cited

U.S. PATENT DOCUMENTS

| | | | |
|---|---|---|---|
| 3,949,146 | 4/1976 | Kane et al. | 427/255.3 |
| 4,292,347 | 9/1981 | Donley | 427/168 |
| 4,469,045 | 9/1984 | Chesworth | 427/255 |
| 4,476,158 | 10/1984 | Baumberger et al. | 427/166 |
| 4,547,400 | 10/1985 | Middleton et al. | 427/166 |
| 4,548,836 | 10/1985 | Middleton et al. | 427/166 |
| 4,721,632 | 1/1988 | Brown | 427/166 |

OTHER PUBLICATIONS

Chemical Abstracts, vol. 92: 98386C, p. 264, 1980.

Primary Examiner—Sadie Childs
Attorney, Agent, or Firm—Donna L. Seidel

[57] ABSTRACT

A method is disclosed for producing a low emissivity metal oxide film on a glass surface within a nonoxidizing atmosphere inside a float bath by applying a metal-containing coating reactant in vapor form in the presure of oxygen to the top surface of a float glass ribbon while the bottom surface is maintained in contact with a molten metal bath in a nonoxidizing atmosphere at a temperature sufficient to thermally react said reactant to form a metal oxide film on the glass surface.

14 Claims, 3 Drawing Sheets

CHEMICAL VAPOR DEPOSITION OF TIN OXIDE ON FLOAT GLASS IN THE TIN BATH

BACKGROUND OF THE INVENTION

The present invention relates generally to the art of producing infrared-reflecting coated glass products, and more particularly to non-iridescent, high transmittance, low emissivity, infrared-reflecting coated glass products.

Transparent infrared-reflecting films such as tin oxide may be deposited on a substrate such as glass by a variety of methods, including the application of thermally decomposable compounds to a heated surface. Useful methods for forming transparent infrared reflecting tin oxide films are taught in U.S. Pat. No. 3,107,177 to Saunders et al, U.S. Pat. No. 3,677,814 to Gillery, and U.S. Pat. No. 4,263,335 to Wagner et al.

Tin oxide films are especially effective infrared reflectors at thicknesses of about 1000 to 8000 Angstroms. However, if the thickness is not sufficiently uniform, the films tend to display a multiplicity of interference color effects commonly referred to as iridescence. Such interference effects render the coated glass aesthetically unacceptable for most architectural applications. Iridescence is not observed in thinner films, however, these films have insufficient infrared reflectance to be practically useful. Likewise, iridescence is not observed in thicker films; however, these films tend to be hazy, have relatively low transmittance, and are difficult to make uniformly. Therefore, various methods to mask interference effects have been developed.

U.S. Pat. No. 3,681,042 to Edwards et al discloses coating a surface of float glass by vaporizing a coating material, entraining the vapor in a stream of hot carrier gas, and directing the gas-borne coating material to the glass surface to be coated, which surface is at a coating-receptive temperature.

U.S. Pat. No. 3,710,074 to Stewart discloses an electrically heated multiple glazed window unit having an electrodconductive coating on an enclosed surface and a selective reflecting film having an absolute infrared reflectance of at least 0.17 to improve the heat insulating character of the unit and reduce the visible iridescence of the conductive film.

U.S. Pat. No. 3,850,679 to Sopko et al discloses depositing a metal oxide coating on a hot glass surface by applying a mixture of carrier air, vaporized solvent and vaporized metal-containing coating reactant to the hot glass surface through a nozzle at a Reynolds number exceeding 2500 with the nozzle-to-glass spacing at least 1.25 times the characteristic dimension of the nozzle.

U.S. Pat. No. 3,852,098 to Bloss et al discloses coating a glass substrate with a metal-containing film by heating the glass and contacting the glass with a gaseous mixture from 50 to 100 percent saturated with the vapor of a reactive metal compound at its temperature immediately before contacting the glass. The gaseous mixture is then heated by the glass to a sufficient temperature to cause the metal compound to react thereby depositing the film.

U.S. Pat. No. 4,206,252 to Gordon describes transparent glass windows having a first coating of infrared reflective material displaying iridescence which is markedly reduced by provision of a layer of continuously varying refractive index between the glass and the coating. The invention also encompasses processes for making such windows.

U.S. Pat. No. 4,294,193 to Gordon describes a vapor coating apparatus for producing the coated glass described above wherein a layer between the glass and the infrared reflective coating has a refractive index which increases continuously from the glass to the coating. The apparatus is described as suitable for use in making coatings of gradually changing compositions from gaseous reactants in general.

U.S. Pat. No. 4,325,988 to Wagner discloses a method and apparatus for producing a film on a substrate surface from a cloud of dust-sized particles of a coating reactant, preferably using a jet mill.

U.S. Pat. No. 4,344,986 to Henery discloses a method for depositing a coating from a powder coating reactant wherein turbulence is created in the carrier gas stream.

U.S. Pat. No. 4,377,613 to Gordon discloses transparent window structures comprising a glass sheet bearing a coating of infrared reflective material wherein the observance of iridescence is reduced by provision of a very thin coating system beneath the infrared reflective coating which reflects and refracts light to interfere with the observation or iridescence.

U.S. Pat. No. 4,401,695 to Sopko discloses a method and apparatus for depositing a coating from a gaseous stream of powder coating reactant, wherein the carrier gas is supplied at a high volume rate and low pressure.

U.S. Pat. No. 4,144,362 to Larkin discloses a method of producing a stannic oxide coating on a heated glass article using finely divided liquid monobutyltin trichloride wherein unpyrolyzed reactant is recovered for subsequent reuse.

U.S. Pat. Nos. 4,187,366; 4,206,252 and 4,308,316 to Gordon disclose transparent glass window structures comprising a glass sheet bearing a first coating of infrared reflective material, wherein the observance of iridescence resulting from the first coating is reduced by a second coating of particular refractive index and thickness providing at least two interfaces forming means to reflect and refract light to interfere with the observance of iridescence.

SUMMARY OF THE INVENTION

The present invention provides a method for depositing a relatively thick, non-iridescent, infrared-reflective tin oxide film onto a float glass surface while the glass is still supported in the tin bath in a nonoxidizing atmosphere. By coating the glass on the bath, a higher glass surface temperature provides a tin oxide coating with lower resistance and therefore lower emissivity at a given coating thickness.

DESCRIPTION OF THE PREFERRED EMBODIMENT

Figure 1:
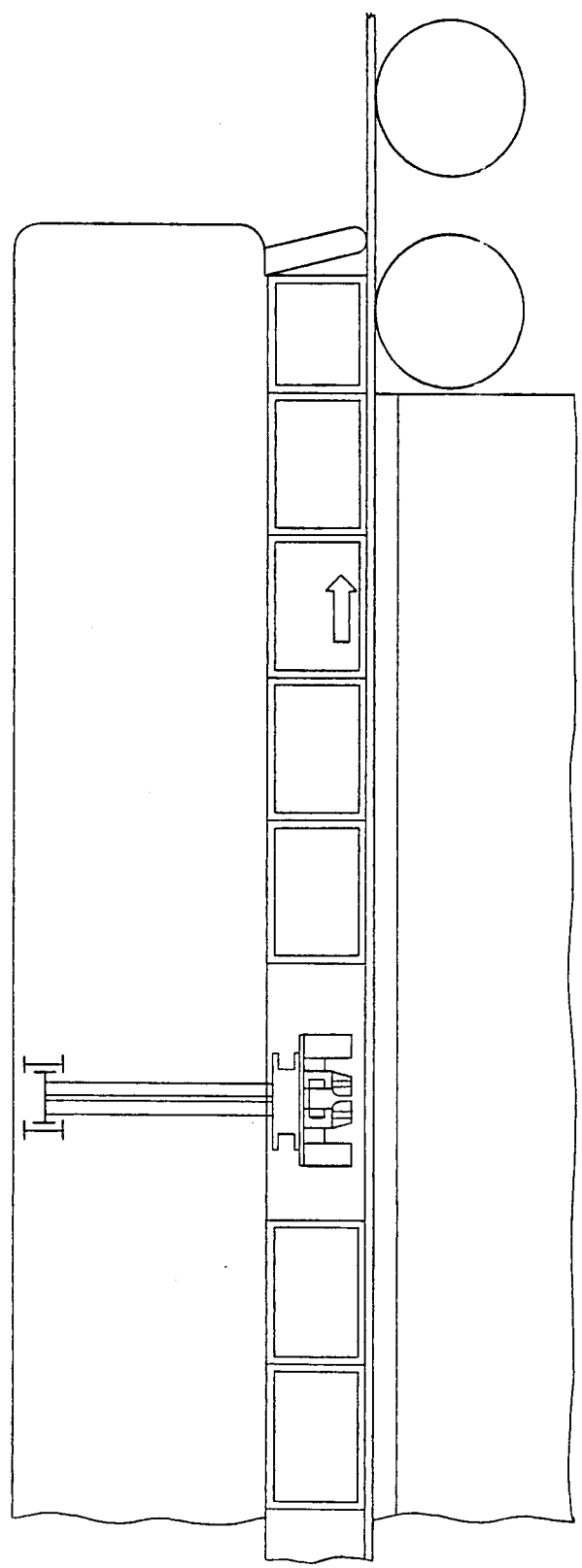
FIG. 1 illustrates the position of a coater in the float glass bath in accordance with the present invention.

Referring to FIG. 1, a glass substrate, preferably clear soda-lime-silica-glass, in the form of a continuous float glass ribbon is conveyed in a horizontal position through a coating station while the glass is supported on molten metal, preferably tin, in a float bath in a nonoxidizing atmosphere, preferably nitrogen.

Figure 2:
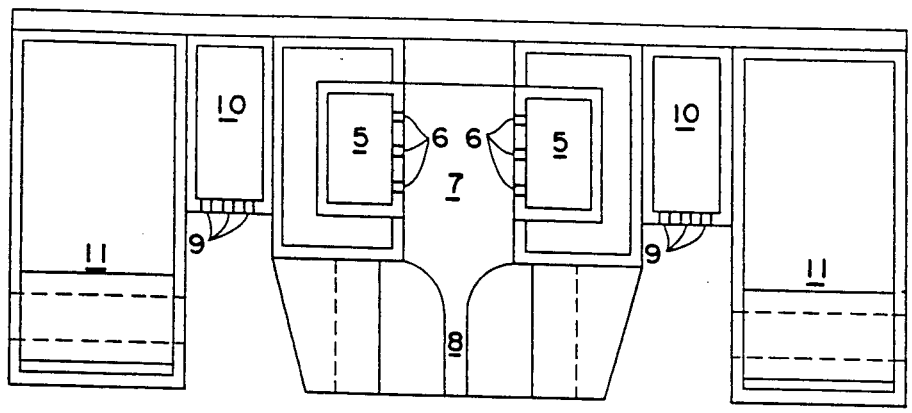
FIG. 2 is an enlarged view of the coater of FIG. 1.

The coating apparatus illustrated in FIG. 2 is located above the glass ribbon at a point where the glass surface temperature is preferably in the range of 1150° to 1250° F. (about 621° to 677° C.), most preferably about 1200° to 1250° F. (about 649° to 677° C.). The coating apparatus directs a gaseous stream comprising a carrier gas, preferably air, and a coating reactant, preferably butyltin trichloride, into contact with the hot glass surface, whereupon the coating reactant thermally decomposes to form a tin oxide film.

The coating apparatus of the present invention comprises a narrow chamber with the coating reactant inlet end, and an outlet end substantially as long as the width of the glass area to be coated. The chamber is supplied with a mixture of carrier gas and coating reactant vapor. The coating reactant is preferably vaporized before it enters the chamber in order to save the space that would be required to place vaporizing means inside the chamber. The chamber is preferably tapered from a cylindrical-shaped inlet end to a narrow slot-shaped outlet end or nozzle which directs the vaporized coating reactant gaseous mixture to the glass surface to be coated. Suitable nozzles are described in detail in U.S. Pat. Nos. 3,850,679 to Sopko et al; 3,888,649 and 3,942,469 to Simhan, the disclosures of which are incorporated herein by reference. In a most preferred embodiment, a distributor is placed between the chamber and the nozzle to promote uniform distribution of the coating reactant vapor along the length of the nozzle. A preferred distributor is a structural element, positioned over the outlet end of the chamber, having a plurality of evenly spaced apertures through which the vapor passes into the nozzle. Preferably, the individual jets of coating reactant vapor and carrier gas are diffused before the mixture exits from the nozzle. Diffusion may be accomplished by means of diffuser elements in the inlet end of the nozzle, similar in configuration to the baffles shown in the powder coater of U.S. Pat. No. 4,344,986 to Henery, the disclosure of which is incorporated herein by reference.

Preferred coating reactants for chemical vapor deposition of a low emissivity coating in the float bath in accordance with the present invention are organometallic compounds, preferably organotin compounds. Many organometallic compounds which exist in solid form at ambient temperature may be employed in solution for vaporization and chemical vapor deposition.

A variety of aliphatic and olefinic hydrocarbons and halocarbons are suitable as solvents in carrying out the methods disclosed herein. Single component solvent systems, particularly a solvent system employing methylene chloride, are effectively employed in the present invention. Solvent systems employing two or more solvents are also found to be particularly useful. Some representative solvents which may be employed in carrying out the present invention are: methylene bromide; carbon tetrachloride; carbon tetrabromide; chloroform; bromoform; 1,1,1-trichloroethane; perchlorethylene; 1,1,1-trichloroethane; dichloroiodomethane; 1,1,2-tribromoethane; trichloroethylene; tribromoethylene; trichlormonofluoroethane; hexachloroethane; 1,1,1,2-tetrachloro-2-fluoroethane; 1,1,2-trichloro-1,2-difluoroethane; tetrafluorobromethane; hexachlorobutadiene; tetrachloroethane; etc. and mixtures thereof. Other solvents may also be employed, particularly as mixtures of one or more organic polar solvents, such as an alcohol containing 1 to 4 carbon atoms and one hydroxyl group and one or more aromatic nonpolar compounds, such as benzene, toluene or xylene. The volatility of these materials makes their use less preferred than the use of the above preferred halogenated hydrocarbons and halocarbons, but they have particular economic utility.

A solution of a reactive organometallic salt in an organic solvent may be directed to a vaporizing chamber. The vaporizing chamber is constructed so as to provide a heating element which heats the space surrounding the element to a temperature sufficient to vaporize the coating solution within that space, rather than vaporizing the liquid only in contact with the heating element itself. A carrier gas is directed across and away from the heater to intercept the coating composition to mix with it, enhancing its rate of vaporization, and to carry the vapors through the heater to the substrate to be coated. Vapors of the solvent and organometallic coating reactant are directed from the vaporizer to the coater shown in the drawing.

Some preferred organometallic compounds in accordance with the present invention are liquid at ambient temperature, and may be employed without the use of solvents. A particularly preferred organometallic compound is monobutyltin trichloride, a colorless liquid, characterized by an atmosphere boiling point of 420° F. (221° C.), a partial pressure of 0.1 atmosphere of 310° F. (154.4° C.), heat of vaporization of 14.5 kilocalories and entropy of vaporization of 29.4 Clausius per mole. Monobutyltin trichloride is preferably vaporized by contact with hot carrier gas, typically air, preferably maintained at a temperature below about 400° F. (204° C.) to avoid decomposition, typically about 385° F. (196° C.). Suitable vaporizers are described in detail in U.S. Pat. Nos. 3,970,037 to Sopko and 4,297,971 to Henery, the disclosures of which are incorporated herein by reference.

In a preferred embodiment of the present invention, a fraction of the total volume of heated carrier gas is mixed with the monobutyltin trichloride in a vaporizer comprising a coil of tubing immersed in hot oil. The heavily saturated mixture of coating reactant vapor in carrier gas is then diluted with additional heated carrier gas in the chamber en route to the nozzle which delivers the coating reactant to the glass surface. Preferably, monobutyltin trichloride is doped with a fluorine-containing compound to enhance the conductivity of the tin oxide film formed therefrom. A preferred dopant is trifluoroacetic acid, preferably in the range of 1 to 10 percent, most preferably about 5 percent by weight.

In order to minimize the possibility of contamination of the deposited film by unreacted or undeposited coating reactant or reaction by-products, the coating apparatus of the present invention comprises integral exhaust means. Adjacent the nozzle along substantially its entire length is an aperture maintained at a negative pressure to provide exhaust means for removing unreacted coating reactant, undeposited reaction product and reaction by-products from the coating site so that neither the freshly coated surface nor the approaching surface to be coated becomes contaminated. Since the chemical vapor deposition method of the present invention does not depend on diffusion of the coating reactant vapor through the normal boundary layer, it is not limited to coating reactants with high entropies of vaporization as disclosed in U.S. Pat. No. 3,852,098 to Bloss et al, the disclosure of which is incorporated herein by reference.

Figure 4:
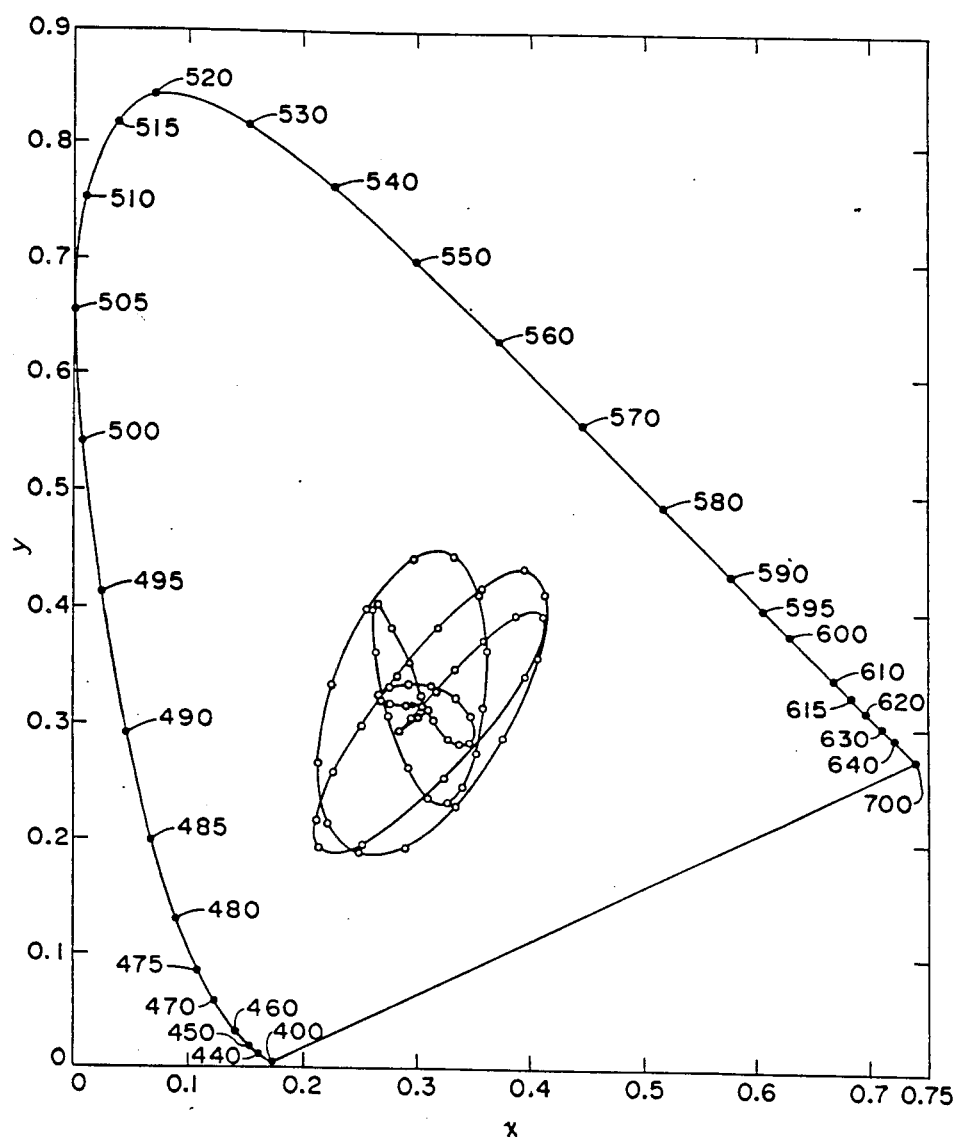
FIG. 4 is a chromaticity diagram with the x and y chromaticity coordinates measured on the corresponding x and y axes. The wavelengths of observed colors are marked about the periphery. Point C marks the coordinates for illuminant C in accordance with the Commission Internationale de L'Eclairage (CIE). The spiral shaped curve is a plot of the chromaticity coordinates of tin oxide films at increasing film thicknesses. Points A and B mark the thicknesses corresponding with the preferred coating thickness range of the present invention.

Preferred tin oxide infrared reflecting films in accordance with the present invention have a resistivity less than about 40 ohms per square, preferably 25 ohms per square or less, and low emissivity, preferably less than 0.2. The thickness of the film is chosen to correspond with a minimum in the luminous reflectance curve which plots luminous reflectance as a function of film thickness. The preferred thickness of a tin oxide film deposited on float glass in the bath in accordance with the present invention is in the range of 2500 to 3500 Angstroms, most preferably about 3200 Angstroms. A tin oxide film of this thickness exhibits a third order blue interference color as shown in FIG. 4, and an emissivity as low as 0.15 when produced in accordance with the present invention.

The advantage of depositing a tin oxide coating in the float bath are not only the decreased resistance and lower emissivity exhibited by the film, but also the improved coating uniformity which results from temperature uniformity of the substrate provided by contact of the glass with the molten tin in the bath, and reduced reflected distortion which results from higher substrate coating temperatures available without additionally heating the glass.

Figure 3:
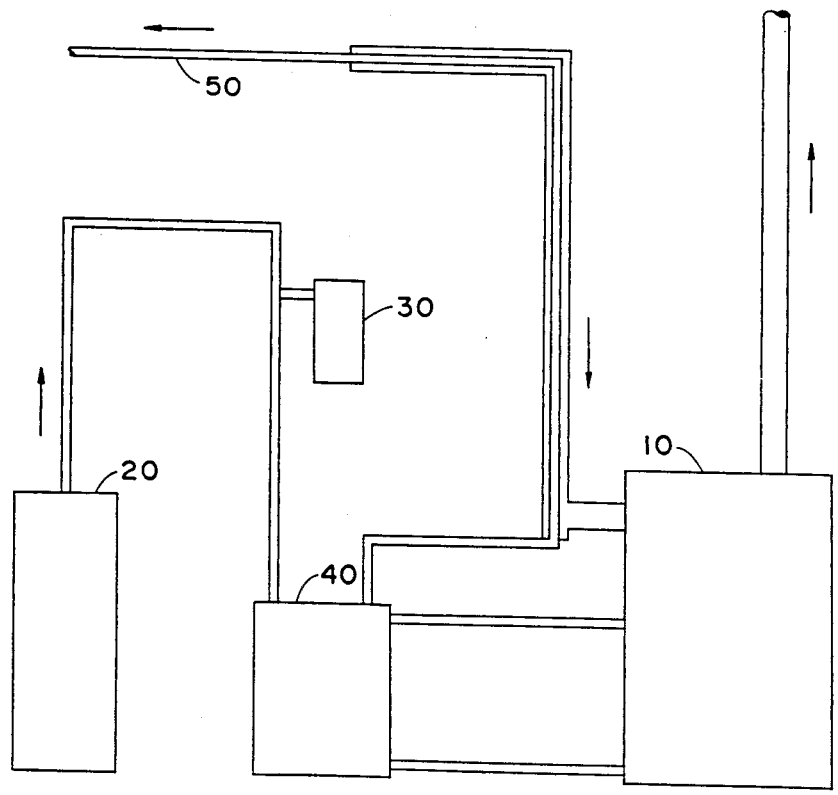
FIG. 3 is a flow schematic of the carrier gas, coating reactant, vaporizer and heat exchange system which feeds the coater of FIG. 2.

Referring to FIG. 3, coating reactant in recirculating pump system 10 is preheated to 350° F. (about 177° C.). Carrier air is preheated in an air heater 20 also to 350° F. (about 177° C.). The carrier air is supplied at 20 standard cubic feet per minute per 30 inches (76.2 centimeters) of slot length at a 3/16th inch (4.8 millimeter) slot width. The carrier air velocity is preferably about 950-1150 feet (about 290 to 351 meters) per minute. The carrier air picks up coating reactant from supply 30 until the air is essentially saturated. The carrier air/coating reactant vapor mixture travels to the coating vaporizer 40 which is also maintained at a temperature of about 350° F. (about 177° C.) where the coating reactant becomes completely vaporized. The vaporized coating reactant and carrier air mixture travels through heated transport lines 50 to the coating vapor distributor cavities 5 shown in FIG. 2. The vaporized coating reactant is distributed through orifices 6 into the vapor cavity 7 from which it is directed through the nozzle 8 to the glass surface as shown in FIG. 1. After the coating reactant thermally reacts with the hot glass surface to form a tin oxide film thereon, the carrier air, unreacted coating reactant vapor and any decomposition by-products are immediately exhausted in a controlled manner through exhaust orifices 9 of the vacuum platens 10. The transport lines, distributor cavities, vapor cavity, exhaust orifices and vacuum platens are all maintained at a constant temperature of about 350° F. (about 177° C.) by means of a circulating oil heat transfer system 11.

Negative pressure sufficient to exhaust the carrier air, unreacted coating reactant and reaction by-product is supplied through exhaust means. The upstream exhaust orifice is preferably about ⅛ inch wide and the downstream orifice about 1 inch. Both run the full length of the coater nozzle. At the coating reactant and carrier gas flow rates of the following examples, the pressure drops measured in inches of water are preferably about 4.3 for the upstream and about 3.7 for the downstream exhaust orifices. The distance between the coater nozzle and the glass is preferably in the range of 0.375 to 0.75 an inch (about 9.5 to 19.1 millimeters), most preferably around 0.5 inch (about 1.3 centimeters) as in the following examples. The bath atmosphere is preferably pure nitrogen at a slight positive pressure, preferably in the range of 0.05 to 0.07 inch (about 1.27 to 1.78 millimeters), most preferably about 0.06 inch (about 1.5 millimeters), of water. The carrier air/vaporized coating reactant mixture as in the following examples preferably comprises about 18 cubic centimeters of reactant in 25 standard cubic feet per minutes of carrier gas per foot of nozzle length, and is preferably supplied at a pressure of about 4 pounds per square inch in laminar flow. The glass line speeds may vary over a wide range, for 2.5 millimeter glass, e.g. a range of 30 to 310 inches (about 0.76 to 7.9 meters) per minute.

The present invention will be further understood from the descriptions of specific examples which follow:

EXAMPLE I

To illustrate the effect of hydrogen in the bath atmosphere on the resistivity of a tin oxide film produced in accordance with the present invention, films of approximately the same thickness, about 2600 Angstroms, were produced in various bath atmosphere. A 3.3 millimeter thick soda-lime-silica float glass ribbon is coated while supported on molten tin in the float bath in the normal bath atmosphere of nitrogen containing about 7% hydrogen. The upper surface of the glass ribbon is contacted at a temperature of about 1227° F. (about 664° C.) with carrier air essentially saturated with vaporized monobutyltin trichloride maintained at a temperature of about 350° F. (about 177° C.) by means of a circulating oil heat exchange system. A tin oxide film deposited at a thickness of about 2600 Angstroms has a resistivity of 900 ohms per square.

EXAMPLE II

A float glass ribbon is coated as in the previous example except that the amount of hydrogen in the float bath atmosphere is reduced to 2%. At a tin oxide coating thickness of 2600 Angstroms, the resistivity of the tin oxide film is 125 ohms per square.

EXAMPLE III

A float glass ribbon is coated as in the previous examples with a tin oxide film except that the float bath atmosphere is pure nitrogen. A tin oxide film deposited at a thickness of 2600 Angstroms has a resistivity of 25 ohms per square. At a resistivity of 25 ohms per square, the emissivity of the tin oxide film is 0.20.

EXAMPLE IV

A 3.3 millimeter thick soda-lime-silica float glass ribbon is coated while supported on molten tin in a float bath in an atmosphere of pure nitrogen. The upper surface of the ribbon is contacted at a temperature of 1227° F. (about 664° C.) with air essentially saturated with vaporized monobutyltin trichloride which is maintained at a temperature of 350° F. (about 177° C.) by means of a circulating oil heat exchange system. Exhaust means adjacent to the coater nozzle remove air, unreacted monobutyltin trichloride and any by-products of thermal decomposition from the coating station without contaminating the surrounding nitrogen atmosphere. A tin oxide film is deposited at a thickness of 3200 Angstroms. The film has a surface resistivity of about 20 ohms per square. The coating has a third order blue-green color and 16 percent luminous reflectance. The luminous transmittance of the coated glass is 72 percent and the emissivity is 0.17.

The above examples are offered to illustrate the present invention, and show the importance of maintaining the surface being coated free from a reducing atmosphere. With the apparatus used in the above examples, it is preferred to eliminate hydrogen from the bath atmosphere. However, various coating reactants, coater designs, process parameters and so on are within the scope of the present invention. While a hydrogen-free bath atmosphere may be preferred, the coating apparatus may also be modified to exclude hydrogen in the bath atmosphere from only the glass surface at which the reaction of the coating reactant is taking place, for example by means of a nitrogen purge about the perimeter of the coater. The scope of the present invention is defined by the following claims.

I claim:

1. A method for depositing a low emissivity metal oxide coating comprising the steps of:
    a. supporting a glass substrate on a molten metal bath;
    b. maintaining a nonoxidizing atmosphere over the molten metal bath and glass substrate;
    c. contacting said glass substrate on the surface which is not supported on said molten metal bath with a vapor mixture comprising a metal-containing coating reactant in vapor form and oxygen; and
    d. thermally reacting said coating reactant vapor in the presence of said oxygen to deposit a metal oxide film on said glass surface while maintaining temperature uniformity of said glass substrate by contact with said molten metal bath in said nonoxidizing atmosphere.

2. A method according to claim 1, wherein said molten metal comprises tin.

3. A method according to claim 2, wherein said molten metal consists essentially of tin.

4. A method according to claim 1, wherein said atmosphere comprises nitrogen.

5. A method according to claim 4, wherein said atmosphere consists essentially of nitrogen.

6. A method for depositing a low emissivity metal oxide coating comprising the steps of:
    a. supporting a glass substrate on a molten metal bath;
    b. maintaining a nonoxidizing atmosphere over the molten metal bath and glass substrate;
    c. contacting said glass substrate on the surface which is not supported on said molten metal bath with an organotin compound coating reactant in vapor form and oxygen; and
    d. thermally reacting said coating reactant in the presence of said oxygen to deposit a tin oxide film on said glass surface while maintaining temperature uniformity of said glass substrate by contact with said molten metal bath in said nonoxidizing atmosphere.

7. A method according to claim 6, where said organotin compound is monobutyltin trichloride.

8. A method for depositing a low emissivity metal oxide coating comprising the steps of:
    a. supporting a glass substrate on a molten metal bath;
    b. maintaining a nonoxidizing atmosphere over the molten metal bath and glass substrate;
    c. contacting said glass substrate on the surface which is not supported on said molten metal bath with a metal-containing coating reactant in vapor form and oxygen, wherein the temperature of the glass surface is in the range of 1150° to 1250° F. (610° to 677° C.); and
    d. thermally reacting said coating reactant in the presence of said oxygen to deposit a metal oxide film on said glass surface while maintaining temperature uniformity of said glass substrate by contact with said molten metal bath in said nonoxidizing atmosphere.

9. A method according to claim 8, wherein the temperature of the glass surface is about 1175° to 1225° F. (about 635° to 663° C.).

10. A method according to claim 1, wherein said glass substrate advances on said molten metal bath through a chamber containing a coating position, said coating reactant is applied to said glass surface in vapor form as said glass substrate advances through said coating position, and oxygen is present at said coating position in said vapor.

11. A method according to claim 10, wherein said coating reactant vapor is applied to said glass surface in a carrier gas.

12. A method according to claim 11, wherein said coating reactant is applied to said glass surface in an oxidizing carrier gas.

13. A method according to claim 12, wherein said carrier gas comprises air.

14. A method according to claim 13, wherein said carrier gas consists essentially of air.

* * * * *